United States Patent
Ose et al.

(10) Patent No.: US 7,888,976 B2
(45) Date of Patent: Feb. 15, 2011

(54) LOAD-DRIVING CIRCUIT HAVING TWO TRANSISTORS SWITCHED FOR HEAT DISSIPATION

(75) Inventors: Tomohisa Ose, Nukata-gun (JP); Shouichi Okuda, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/382,438

(22) Filed: Mar. 17, 2009

(65) Prior Publication Data

US 2009/0278572 A1 Nov. 12, 2009

(30) Foreign Application Priority Data

May 12, 2008 (JP) .............................. 2008-124638

(51) Int. Cl.
 *H03B 1/00* (2006.01)
(52) U.S. Cl. ....................... 327/108; 327/109; 327/110; 323/282; 361/78
(58) Field of Classification Search ......... 327/108–112, 327/378, 390; 323/224, 282–284; 361/56–58, 361/78, 86, 87
See application file for complete search history.

(56) References Cited

U.S. PATENT DOCUMENTS

2004/0239278 A1 12/2004 Kobayashi et al.
2005/0164449 A1 * 7/2005 Yu et al. ...................... 438/253
2007/0012477 A1 * 1/2007 Nakamura et al. .......... 174/260
2007/0296468 A1 12/2007 Okuda

FOREIGN PATENT DOCUMENTS

| JP | A-H10-264765 | 10/1998 |
|---|---|---|
| JP | A-H10-297420 | 11/1998 |
| JP | A-2005-088748 | 4/2005 |
| JP | A-2005-229018 | 8/2005 |
| JP | A-2008-177879 | 7/2008 |

\* cited by examiner

*Primary Examiner*—An T Luu
(74) *Attorney, Agent, or Firm*—Posz Law Group, PLC

(57) ABSTRACT

A load-driving circuit supplies electric current to a load, such as a resistor of an airbag squib. The load-driving circuit includes high side and low side current control circuits, both connected in series. Each current control circuit is composed of a driving transistor, a resistor and a current mirror circuit for controlling operation of the driving transistor. The components in the load-driving circuit are positioned in an integrated circuit chip to generate different temperature gradients among the components. For example, the low side resistor is positioned close to the high side driving transistor, so that the low side resistor is heated by the high side driving transistor controlled under a constant current control. As the low side resistor is heated, the high side driving transistor is switched from the constant current control to a full-on control. In this manner, controls of both driving transistors are automatically switched thereby to avoid overheating of one of the driving transistors.

18 Claims, 10 Drawing Sheets

LOAD-DRIVING CIRCUIT HAVING TWO TRANSISTORS SWITCHED FOR HEAT DISSIPATION

CROSS-REFERENCE TO RELATED APPLICATION

This application is based upon and claims benefit of priority of Japanese Patent Application No. 2008-124638 filed on May 12, 2008, the content of which is incorporated herein by reference.

BACKGROUND OF THE INVENTION

1. Field of the Invention

The present invention relates to a load-driving circuit for driving a load such as a resistor of airbag squib, the load-driving circuit having two transistors that are switched to be equally heated.

2. Description of Related Art

Examples of a load-driving circuit for driving a resistor of an airbag squib by means of a high side transistor and a low side transistor are shown in JP-A-10-264765, JP-A-10-297420 and JP-A-2005-88748. The driving circuit supplies current, when a collision impact is detected by an acceleration sensor, to the resistor of the airbag squib by controlling the low side transistor to a full-on control while controlling the high side transistor to a constant current control. In this case, current is set in the high side transistor and the low side transistor as shown in FIG. 18A attached hereto. A drain-source voltage Vds of the low side transistor (constituted by an LDMOSFET, for example) is almost zero because the low side transistor is used under a full-on state as shown in FIG. 18C. Therefore, influence of heat in the low side transistor is negligible. On the other hand, drain-source voltage Vds of the high side transistor is almost equal to a power source voltage as shown in FIG. 18B. Therefore, the high side transistor is considerably heated, and the heat may exceed a heat margin in the high side transistor. Accordingly, a size of the transistor has to be enlarged, or circuit components which are sensitive to heat have to be separated from the transistor as shown in FIG. 19.

To cope with the above problem, JP-A-2007-328683 proposes to switch the high side transistor and the low side transistor between the full-on control and the constant current control using a timer. However, it is required to provide a timer having a large size in the load-driving circuit.

SUMMARY OF THE INVENTION

The present invention has been made in view of the above-mentioned problem, and an object of the present invention is to provide an improved load-driving circuit in which the high side transistor and the low side transistor are controlled to be equally heated without using a timer.

The load-driving circuit of the present invention is formed as an integrated circuit and is used as a driver for supplying current to a load, such as a resistor of an airbag squib. The load-driving circuit is composed of a high side current control circuit and a low side current control circuit, connected in series to each other. The resistor forming the airbag squib is connected between the high side current control circuit and the low side current control circuit.

The high side current control circuit includes a high side resistor, a high side driving transistor and a high side current mirror circuit for controlling the high side driving transistor. The high side resistor and the high side driving transistor are connected in series. The low side current control circuit includes a low side resistor, a low side driving transistor and a low side current mirror circuit for controlling the low side driving transistor. The low side resistor and the low side driving circuit is connected in series.

Components forming the load-driving circuit are positioned in the integrated circuit chip so that different temperature gradients are formed among the components. For example, the low side resistor is positioned close to the high side driving transistor generating heat, while the low side current mirror circuit is positioned apart from the high side driving transistor. In this manner, the low side resistor is well heated by the heat generated in the high side driving transistor, while the low side current mirror circuit is less heated.

The load-driving circuit is set so that the high side is controlled under a constant current control and the low side is controlled under a full-on control at the beginning of operation. The low side resistor positioned close to the high side transistor is heated by the heat generated in the high side driving transistor. As the low side resistor is heated, the low side is switched from the full-on control to the constant current control. On the other hand, the high side is switched from the constant current control to the full-on control. Under this situation, the low side resistor is cooled and the controls of the high side and the low side return to the original setting. The switching of the controls is performed one time or more than one time during one operation of the load-driving circuit. By switching the controls between the constant current control and the full-on control, the high side driving transistor and the low side driving transistor are evenly heated to thereby suppress an excessive heating of either one of the transistors.

Positioning of the components in the integrated circuit may be variously changed as long as different temperature gradients are formed among the components. A heat insulating trench may be formed between the components to reduce heat transfer therebetween. A heat conducting member may be placed between components to dissipate heat therethrough.

According to the present invention, overheating of one of the two driving transistors is avoided by switching controls between the full-on control and the constant current control. The control-switching is automatically performed without using a timer in the circuit. Other objects and features of the present invention will become more readily apparent from a better understanding of the preferred embodiments described below with reference to the following drawings.

DETAILED DESCRIPTION OF THE PREFERRED EMBODIMENTS

Figure 1:
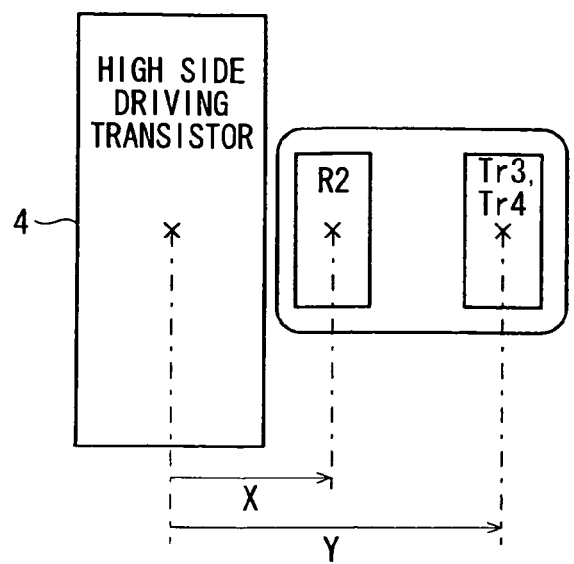
FIG. 1 schematically shows a layout of components of a load-driving circuit in an integrated circuit, as a first embodiment of the present invention.

A load-driving circuit as a first embodiment of the present invention will be described with reference to FIGS. 1-4. The load-driving circuit is used for supplying current to a resistor of an airbag squib. The load-driving circuit is formed as an integrated circuit (IC-chip). First, a structure of the load-driving circuit will be described with reference to FIG. 3. The load-driving circuit 1 includes four terminals P1, P2, P3 and P4. A power source terminal Vdd is connected to the terminal P1, a resistor 2 of the airbag squib is connected between the terminals P2 and P3. The terminal P4 is grounded. The terminal P1 is referred to as a high potential terminal, and the terminal P4 is referred to as a low potential terminal or a ground terminal (GND terminal).

The load-driving circuit 1 includes a high side control portion (referred to as a high side) HS and a low side control portion (referred to as a low side) LS. In the high side HS, a high side resistor R1 and a P-channel MOSFET 4 (a high side driving transistor) are connected in series between the terminals P1 and P2. In the low side LS, a low side resistor R2 and an N-channel MOSFET 5 (a low side driving transistor) are connected in series between the terminals P3 and P4. The MOSFETs 4 and 5 are constituted by LDMOS (Laterally Defused MOS) for example.

In the high side HS, a non-inverted input terminal of a comparator 7H is connected to a junction of the resistor R1 and the MOSFET 4, and a constant voltage of a constant voltage source 8 is supplied to an inverted input terminal of the comparator 7H. The comparator 7H compares a source voltage of the MOSFET 4 with the constant voltage (a reference voltage) of the constant voltage source 8 and outputs a signal representing the comparison result to a driving circuit 9. A control signal is supplied to the driving circuit 9 from a control logic 10 to thereby adjust a gate-source voltage Vgs of the MOSFET 4.

In the low side LS, an inverted input terminal of a comparator 7L is connected to a junction of the resistor R2 and the MOSFET 5, and a constant voltage of a constant voltage source 11 is supplied to a non-inverted input terminal of the comparator 7L. The comparator 7L compares a source voltage of the MOSFET 5 with the constant voltage (a reference voltage) of the constant voltage source 11 and outputs a signal representing the comparison result to a driving circuit 12. A control signal is supplied to the driving circuit 12 from a control logic 13 to thereby adjust a gate-source voltage Vgs of the MOSFET 5. The circuit structure shown in FIG. 3 corresponds to a circuit in which a timer, an AND-gate, a NAND-gate and a NOT-gate are removed from a circuit shown in FIG. 1 of JP-2007-328683 (mentioned above).

Figure 4:
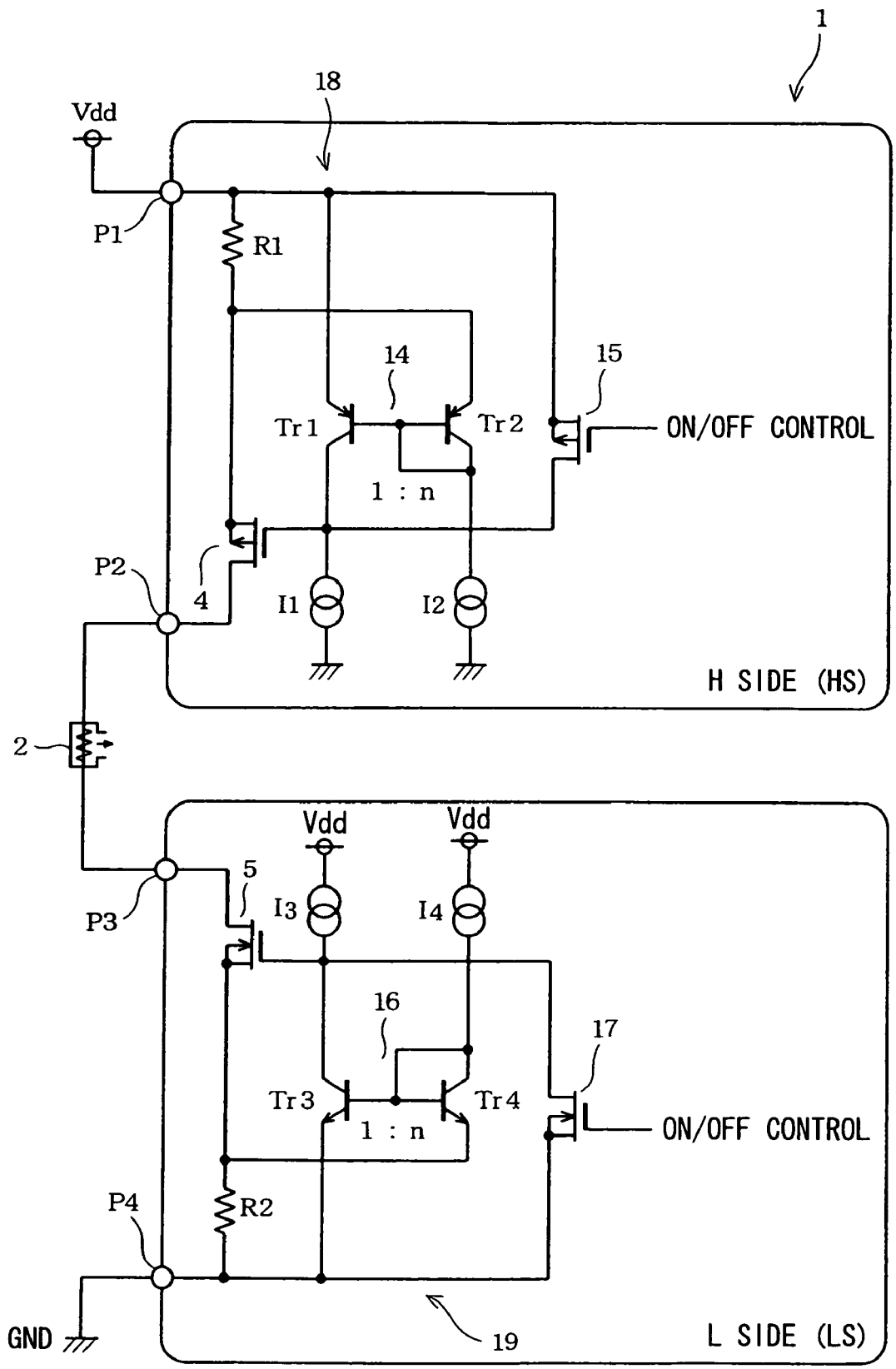
FIG. 4 is a circuit diagram showing the load-driving circuit in detail.

The load-driving circuit 1 will be described in detail with reference to FIG. 4 showing details of the circuit. In the high side (HS), a PNP transistor Tr1 and a constant current source I1 are connected in series between the terminal P1 and the ground. A PNP transistor Tr2 and a constant current source I2 are connected in series between a source of the MOSFET 4 and the ground. The transistors Tr1 and Tr2 constitute a current mirror circuit 14. Bases of both transistors Tr1 and Tr2 are commonly connected to a collector of the transistor Tr2. The collector of the transistor Tr1 is connected to the gate of the MOSFET 4. A mirror ratio of the transistors Tr1 and Tr2 is set to 1:n. A P-channel MOSFET 15 is connected between the terminal 1 and the gate of the MOSFET 4. Control signals are fed to the gate of the MOSFET 15.

In the low side (LS), a constant current source I3 and an NPN transistor Tr3 are connected in series between the power source Vdd and the ground. A constant current source I4 and an NPN transistor Tr4 are connected in series between the power source Vdd and the source of the MOSFET 5. The transistors Tr3 and Tr4 constitute a current mirror circuit 16. Bases of both transistors Tr3 and Tr4 are commonly connected to a collector of the transistor Tr4. The collector of the transistor Tr3 is connected to the gate of the MOSFET 5. A mirror ratio of the transistors Tr3 and Tr4 is set to 1:n. An N-channel MOSFET 17 is connected between the gate of the MOSFET 5 and the terminal P4. Control signals are fed to the gate of the MOSFET 17.

When current I flows through the resistor R1 in the high side (HS), the following relation exists between a base-emitter voltage Vbe1 of the transistor Tr1 and a base-emitter voltage Vbe2 of the transistor Tr2 under operation of the current mirror circuit 14: $Vbe1 = R1 \cdot I + Vbe2$. The gate voltage of the MOSFET 4 is maintained to satisfy the above relation. Similarly, when current I flows through the resistor R2 in the low side (LS), the following relation exists between a base-emitter voltage Vbe3 of the transistor Tr3 and a base-emitter voltage Vbe4 of the transistor Tr4 under operation of the current mirror circuit 16: $Vbe3 = R2 \cdot I + Vbe4$. The gate voltage of the MOSFET 5 is maintained to satisfy the above relation.

Figure 3:
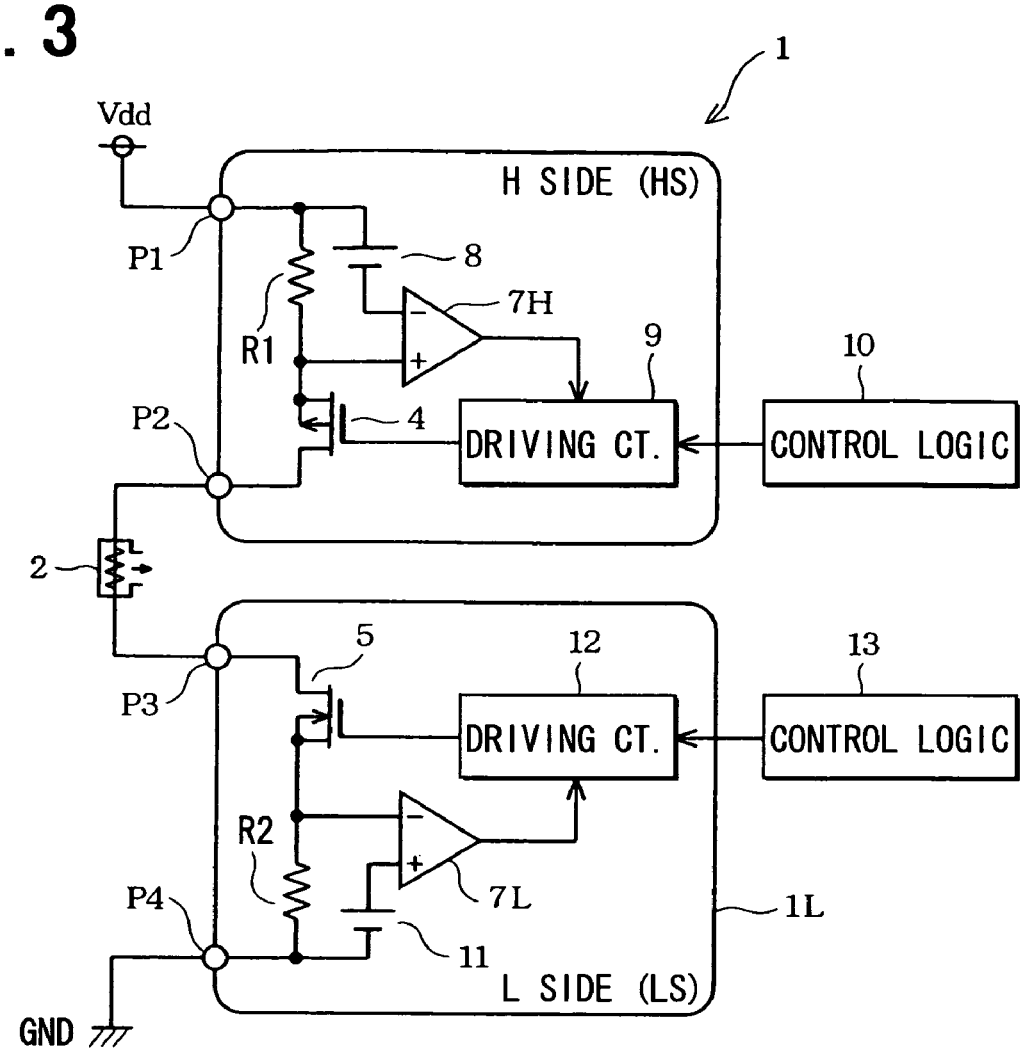
FIG. 3 is a circuit diagram showing the load-driving circuit.

In other words, the current mirror circuit 14 corresponds to the comparator 7H, the constant voltage source 8 and the driving circuit 9 shown in FIG. 3. Similarly, the current mirror circuit 16 corresponds to the comparator 7L, the constant voltage source 11 and the driving circuit 12 shown in FIG. 3. The high side resistor R1, the current mirror circuit 14 and the constant current sources I1, I2 constitute a high side current control circuit 18 shown in FIG. 4. Similarly, the low side resistor R2, the current mirror circuit 16 and the constant current sources I3, I4 constitute a low side current control circuit 19 shown in FIG. 4.

Operation of the load-driving circuit 1 will be described with reference to FIGS. 1-4. FIG. 1 schematically shows a layout of the components of the load-driving circuit 1 in an integrated circuit. For example, at a start of the operation, the low side MOSFET 5 is set to a full-on control while the high side MOSFET 4 is set to a constant current control. As shown in FIG. 1, the low side resistor R2 is positioned close to the high side MOSFET 4 (a distance X), and the transistors Tr3, Tr4 forming the low side current mirror circuit 16 are positioned apart from the high side MOSFET 4 (a distance Y, Y>X).

When no current is supplied to the load 2, both control logics 10, 13 keep both FETs 15, 17 turned on, maintaining both MOSFETs 4, 5 turned off. When an acceleration sensor detects an acceleration exceeding a predetermined level, signals representing the acceleration are outputted to both control logics 10, 13, turning off both FETs 15, 17. In response to turning-off of the FETs 15, 17, both MOSFETs 4, 5 are turned on. Current is supplied to the load 2 from the power source Vdd through the high side resistor R1, the MOSFET 4, the load 2, the MOSFET 5 and the low side resistor R2.

Figure 2A:
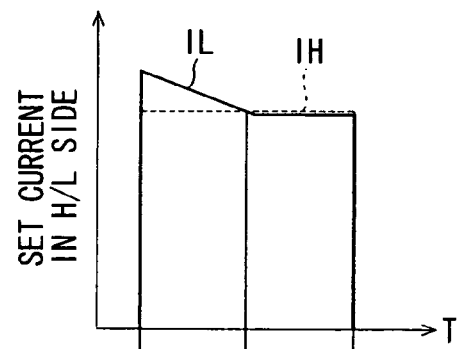
FIG. 2A shows current set in a high side and a low side in the load-driving circuit.
Figure 2B:
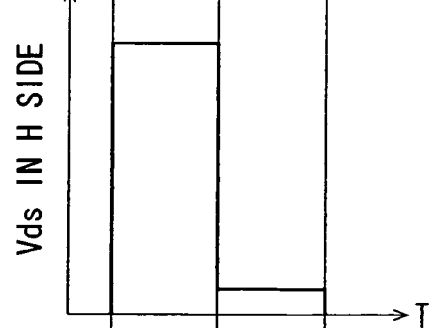
FIG. 2B shows a drain-source voltage Vds in a high side transistor.
Figure 2C:
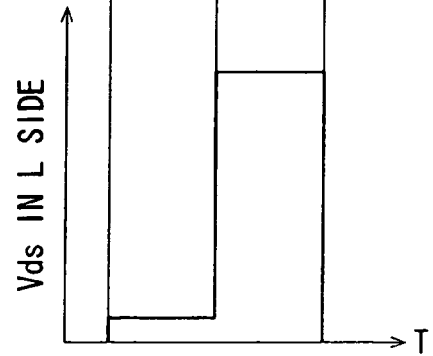
FIG. 2C shows a drain-source voltage Vds in a low side transistor.

The high side current control circuit 18 and the low side current control circuit 19 are so set (by setting values of the resistors R1, R2, for example, to proper levels) that the high side (HS) starts from the constant current control and the low side (LS) starts from the full-on control. FIG. 2A shows current IH set in the high side (dotted line) and current IL set in the low side (solid line). The current set in the high side or the low side means an amount of current that can be supplied to the load 2 when the low side or the high side is separately operated as a single unit. Since the high side (HS) and the low side (LS) are connected in series in the present embodiment, an actual amount of current supplied to the load 2 is determined by the amount of current whichever lower in the high side and the low side.

Since the high side (HS) is set to start from the constant current control and the low side (LS) is set to start from the full-on control, current IH is supplied to the load 2 at the beginning of operation. At this time, the drain-source voltage Vds of the MOSFET 4 in the high side is close to the power source voltage and the drain-source voltage Vds of the MOSFET 5 in the low side is close to the ground level voltage (refer to FIGS. 2B, 2C). Under this situation, the resistance of the low side resistor R2 gradually increases because it is heated by heat generated in the MOSFET 4. Accordingly, the amount of current supplied to the load 2 through the MOSFET 5 and the resistor R2 decreases. On the other hand, the set current IH is constant because the high side current control circuit 18 is not affected by the heat generated in the MOSFET 4. Therefore, the set current IL in the low side becomes gradually lower. When the set current IL in the low side becomes lower than the set current IH in the high side (IL<IH), the low side is operated under the constant current control. In the high side, the gate-source voltage of the MOSFET 4 becomes high due to increase in the current flowing through the high side resistor R1, and the high side is switched to the full-on control. As a result, the drain-source voltage Vds of the MOSFET 5 becomes close to the power source voltage, and the Vds of the MOSFET 4 becomes close to the ground level voltage (refer to FIGS. 2B, 2C). At this stage, the MOSFET 5 becomes predominant in generating heat.

In the first embodiment described above, the resistor R2 and the transistors Tr3, Tr4 in the low side current control circuit 19 are positioned in the integrated circuit chip, so that they are differently affected by the heat generated in the MOSFET 4. In this manner, the low side control circuit 19 is switched from the full-on control to the constant current control, while the high side control circuit 18 is switched from the constant current control to the full-on control. More particularly, the high side current control circuit 18 and the low side current control circuit 19 are constituted by the MOSFETs 4, 5 connected in series to the resistors R1, R2 and the current mirror circuits 14, 16 that control operation of the MOSFETs 4, 5. The low side resistor R2 is positioned close to the MOSFET 4 while positioning the transistors Tr3, Tr4 forming the current mirror circuit 16 apart from the MOSFET 4 in the integrated circuit chip, as shown in FIG. 1.

An amount of current flowing through the MOSFET 5 is proportional to temperature of transistors Tr3, Tr4 and inversely proportional to the resistor R2 having a positive temperature coefficient. The full-on control and the constant current control in the high side (HS) and the low side (LS) can be switched by properly adjusting the distance X between the MOSFET 4 and the resistor R2 and the distance Y between the MOSFET 4 and the transistors Tr3, Tr4 (refer to FIG. 1). In this manner, it is avoided that one of the MOSFETs 4, 5 is excessively heated by equally distributing heat to both of the MOSFETs 4, 5. The timer and the associated circuit used in the conventional load-driving circuit disclosed in JP-2007-328683 are not required to distribute heat to both MOSFETs 4, 5.

Figure 5:
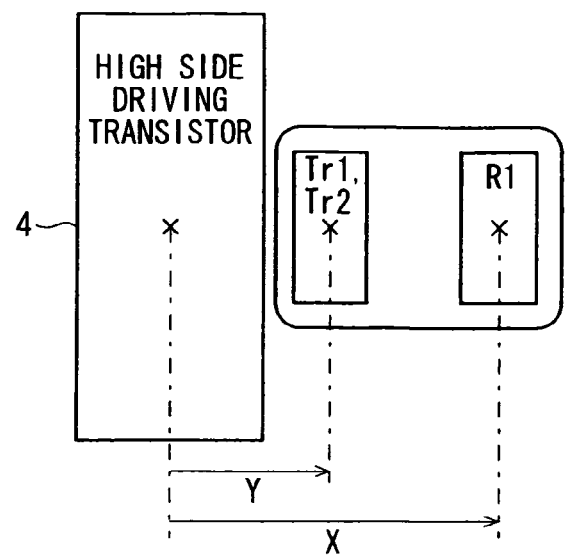
FIG. 5 schematically shows a layout of components of a load-driving circuit in an integrated circuit, as a second embodiment of the present invention.

A second embodiment of the present invention will be described with reference to FIGS. 5 and 6A-6C. FIG. 5 corresponds to FIG. 1 of the first embodiment, FIGS. 6A-6C correspond to FIGS. 2A-2C of the first embodiment. The low side MOSFET 5 is started from the full-on control and the high side MOSFET 4 is started from the constant current control as in the first embodiment.

In this embodiment, as shown in FIG. 5, the transistors Tr1, Tr2 constituting the high side current mirror circuit 14 are positioned close to the high side MOSFET 4 while the high side resistor R1 is positioned apart from the MOSFET 4 in the integrated circuit chip (X>Y). Other structures are the same as those in the first embodiment.

Figure 6A:
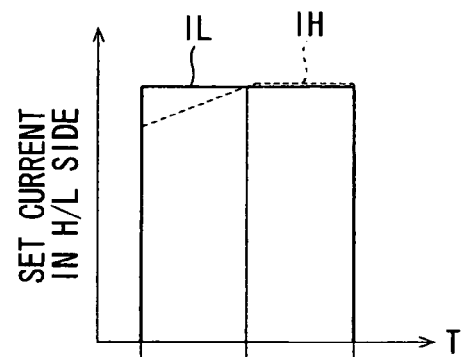
FIGS. 6A, 6B and 6C show a set current and a drain-source voltage in the second embodiment, corresponding to FIGS. 2A, 2B and 2C, respectively.
Figure 6B:
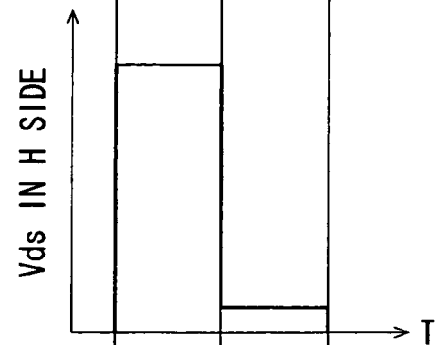
Figure 6C:
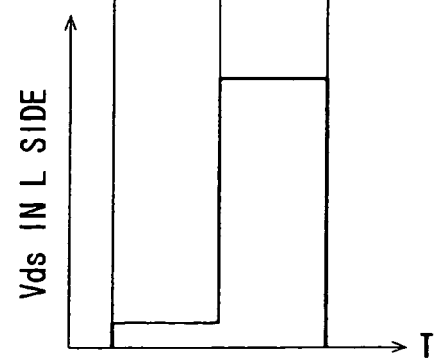

As shown in FIG. 6A, current IH (IH<IL) is supplied to the load 2 at the beginning of the control operation. The current IH gradually increases because transistors Tr1, Tr2 constituting the high side current control circuit 18 are heated by heat generated in the MOSFET 4. On the other hand, the low side set current IL is constant. When the IH becomes higher than IL (IH>IL), the low side current control circuit 19 is switched from the full-on control to the constant current control and the high side current control circuit is switched from the constant current control to the full-on control. In this manner, the same merits attained in the first embodiment are attained in this embodiment, too.

Figure 7:
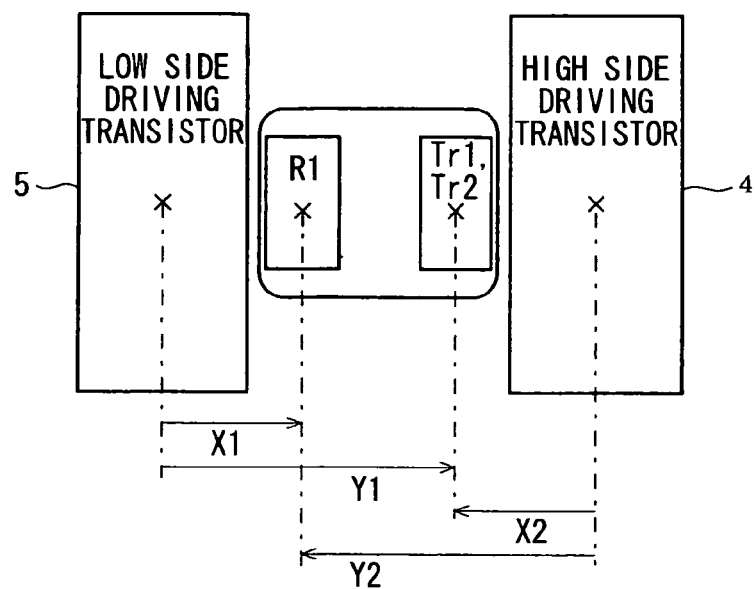
FIG. 7 schematically shows a layout of components of a load-driving circuit in an integrated circuit, as a third embodiment of the present invention.

A third embodiment of the present invention will be described with reference to FIG. 7 and FIGS. 8A-8C. FIG. 7 corresponds to FIG. 1 of the first embodiment and FIGS. 8A-8C correspond to FIGS. 2A-2C of the first embodiment. In this embodiment, the full-on control and the constant current control in the high side and the low side are switched several times in a period in which the current is supplied to the load 2. In this embodiment, as shown in FIG. 7, the transistors Tr1, Tr2 constituting the high side current mirror circuit 14 are positioned close to the high side MOSFET 4, and the high side resistor R1 is positioned close to the low side MOSFET 5. A distance from the low side MOSFET 5 to the high side resistor R1 is X1, and a distance to the transistors Tr1, Tr2 is Y1 (Y1>X1). A distance from the high side MOSFET 4 to the transistors Tr1, Tr2 is X2, and a distance to the high side resistor R1 is Y2 (Y2>X2).

Figure 8A:
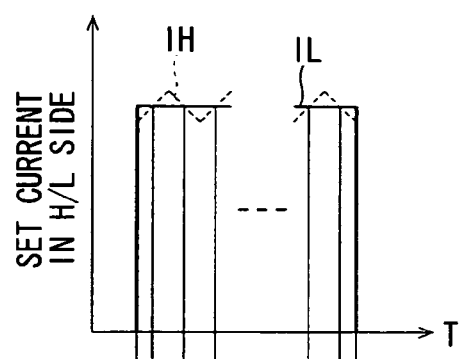
FIGS. 8A, 8B and 8C show a set current and a drain-source voltage in the third embodiment, corresponding to FIGS. 2A, 2B and 2C, respectively.
Figure 8B:
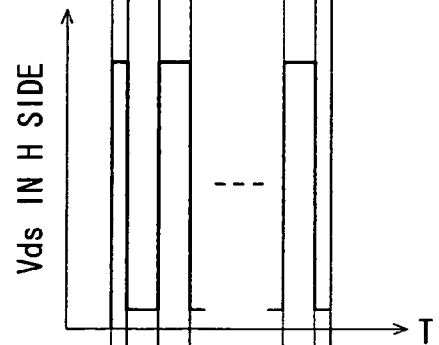
Figure 8C:
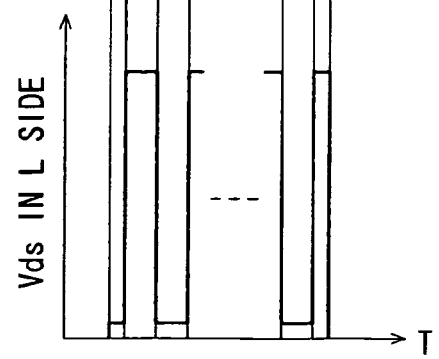

At the beginning of operation, as shown in FIG. 8A, current IH (IH<IL) is supplied to the load 2. As heat is generated in the MOSFET 4, the current IH gradually increases because the transistors Tr1, Tr2 are heated by the heat generated in the MOSFET 4. On the other hand, the current IL in the low side is constant. When the current IH becomes higher than IL (IH>IL), the low side current control circuit 19 is switched to the constant current control, and the high side current control circuit 18 is switched to the full-on control. In this situation, the high side resistor R1 is heated by heat generated in the MOSFET 5, and the current IH gradually decreases. When the current IH becomes lower than IL (IH<IL), the high side current control circuit 18 is switched to the constant current control, and the low side current control circuit 19 is switched to the full-on control. Switching of the control between the constant current control and the full-on control in the high side current control circuit and the low side current control circuit is repeated several times (refer to FIGS. 8B, 8C).

As described above, in the third embodiment, the high side resistor R1 is positioned close to the low side MOSFET 5, and the transistors Tr1, Tr2 forming the high side current control circuit are positioned close to the high side MOSFET 4. The full-on control and the constant current control in the high side and the low side can be switched several times, thus reducing a peak of heat generated in the MOSFETs 4, 5.

Figure 9:
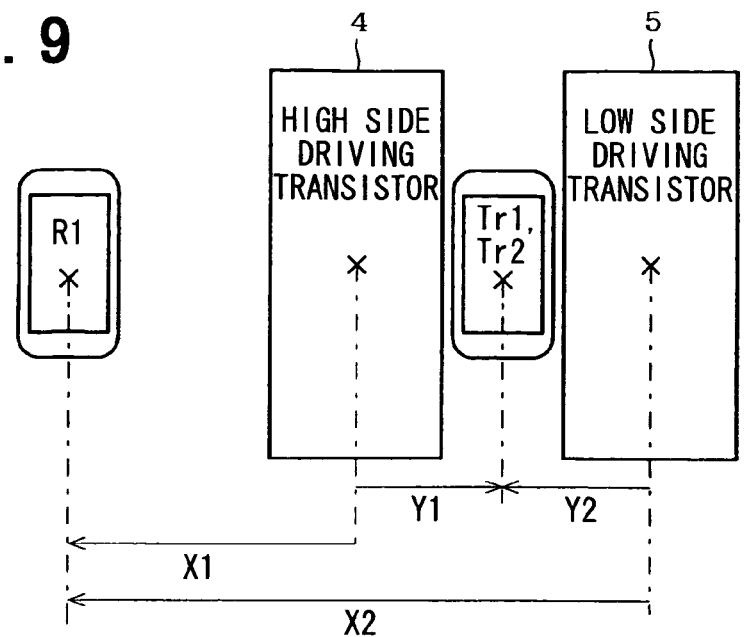
FIG. 9 schematically shows a layout of components of a load-driving circuit in an integrated circuit, as a fourth embodiment of the present invention.
Figure 10A:
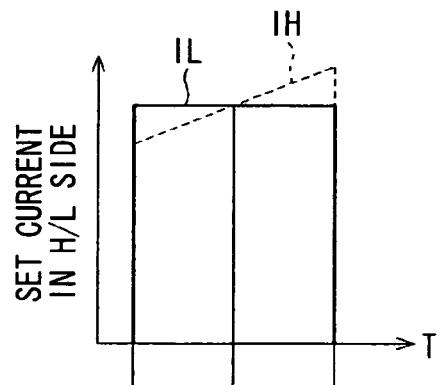
FIGS. 10A, 10B and 10C show a set current and a drain-source voltage in the fourth embodiment, corresponding to FIGS. 2A, 2B and 2C, respectively.
Figure 10B:
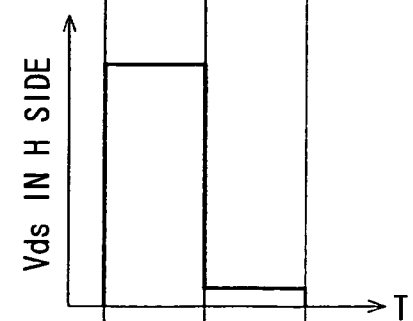
Figure 10C:
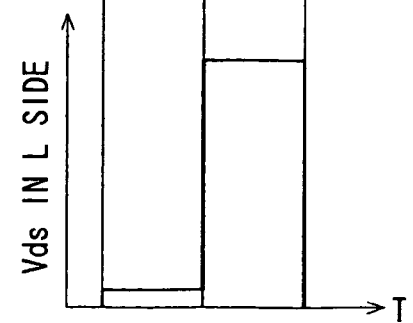

A fourth embodiment of the present invention will be described with reference to FIG. 9 and FIGS. 10A-10C. FIG. 9 corresponds to FIG. 1 of the first embodiment, and FIGS. 10A-10C correspond to FIGS. 2A-2C of the first embodiment. In this embodiment, as shown in FIG. 9, the transistors Tr1, Tr2 in the high side are positioned between the high side MOSFET 4 and the low side MOSFET 5. The transistors Tr1, Tr2 are positioned close to both MOSFETs 4, 5. The high side resistor R1 is positioned apart from the MOSFETs 4, 5. A distance from the MOSFET 4 to the resistor R1 is X1, and a distance from the MOSFET 5 to the resistor R1 is X2. A distance from the MOSFET 4 to the transistors Tr1, Tr2 is Y1, and a distance from the MOSFET 5 to the transistors Tr1, Tr2 is Y2. Relations between these distances are: X1>Y1 and X2>Y2.

At the beginning of the control operation, current IH is supplied to the load 2 as in the second embodiment. The current IH gradually increases as the transistors Tr1, Tr2 are heated by the heat generated in the MOSFET 4. When the IH becomes higher than IL (IH>IL), the low side current control circuit 19 is switched to the constant current control, and the high side current control circuit 18 is switched to the full-on control. Then, the MOSFET 5 generates heat, and the transistors Tr1, Tr2 are continuously heated by the heat of the MOSFET 5, thereby further increasing the current IH (refer to FIG. 10A). In this embodiment, the high side set current IH continues to increase after the low side current control circuit 19 is switched to the constant current control (refer to FIGS. 10A-10C). Therefore, switching of the controls is further stably performed.

Figure 11:
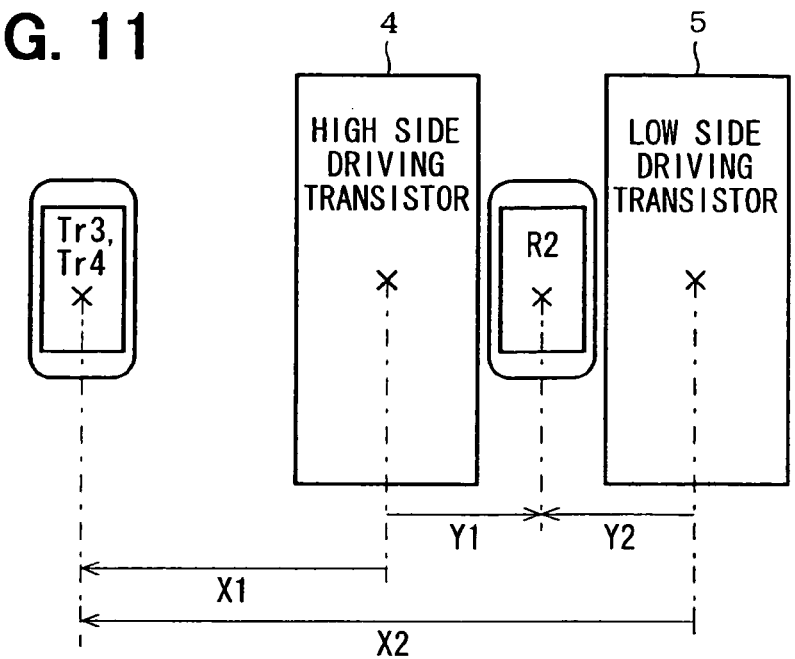
FIG. 11 schematically shows a layout of components of a load-driving circuit in an integrated circuit, as a fifth embodiment of the present invention.
Figure 12A:
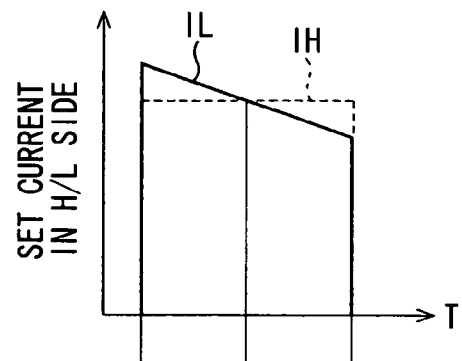
FIGS. 12A, 12B and 12C show a set current and a drain-source voltage in the fifth embodiment, corresponding to FIGS. 2A, 2B and 2C, respectively.
Figure 12B:
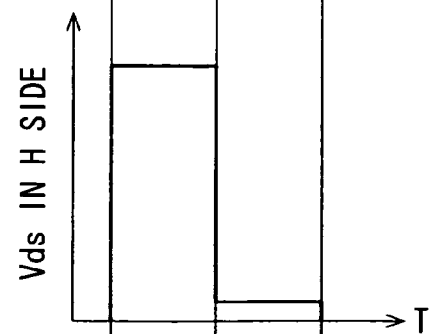
Figure 12C:
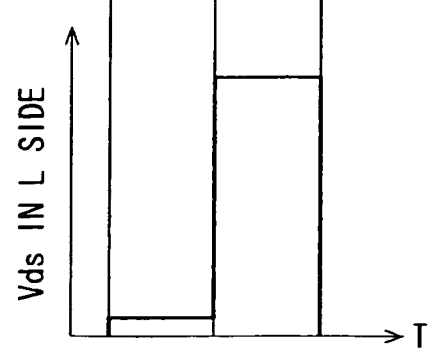

A fifth embodiment of the present invention will be described with reference to FIG. 11 and FIGS. 12A-12C. FIG. 11 corresponds to FIG. 1 of the first embodiment, and FIGS. 12A-12C correspond to FIGS. 2A-2C of the first embodiment. As shown in FIG. 11, the low side resistor R2 is positioned close to and between the MOSFETs 4, 5. The transistors Tr3, Tr4 are positioned apart from both MOSFETs 4, 5. A distance between the MOSFET 4 and transistors Tr3, Tr4 is X1, and a distance between the MOSFET 5 and the transistors Tr3, Tr4 is X2. A distance between the MOSFET 4 and the resistor R2 is Y1, and a distance between the MOSFET 5 and the resistor R2 is Y2. Relations between these distances are: X1>Y1 and X2>Y2.

At the beginning of the control operation, current IH (IH<IL) is supplied to the load 2 as in the first embodiment. As the MOSFET 4 is heated, the resistance of the low side resistor R2 is increased by the heat of the MOSFET 4, and thereby the current IL gradually decreases. When the IL becomes lower than IH (IL<IH), the low side current control circuit 19 is switched to the constant current control, and the high side current control circuit is switched to the full-on control. Then, the MOSFET 5 is heated, and the resistor R2 is continuously heated, continuously decreasing the current IL (refer to FIGS. 12A-12C). In this embodiment, the current IL set in the low side continues to decrease after the low side current control circuit 19 is switched to the constant current control. Therefore, the switching of operation is stably performed.

Figure 13:
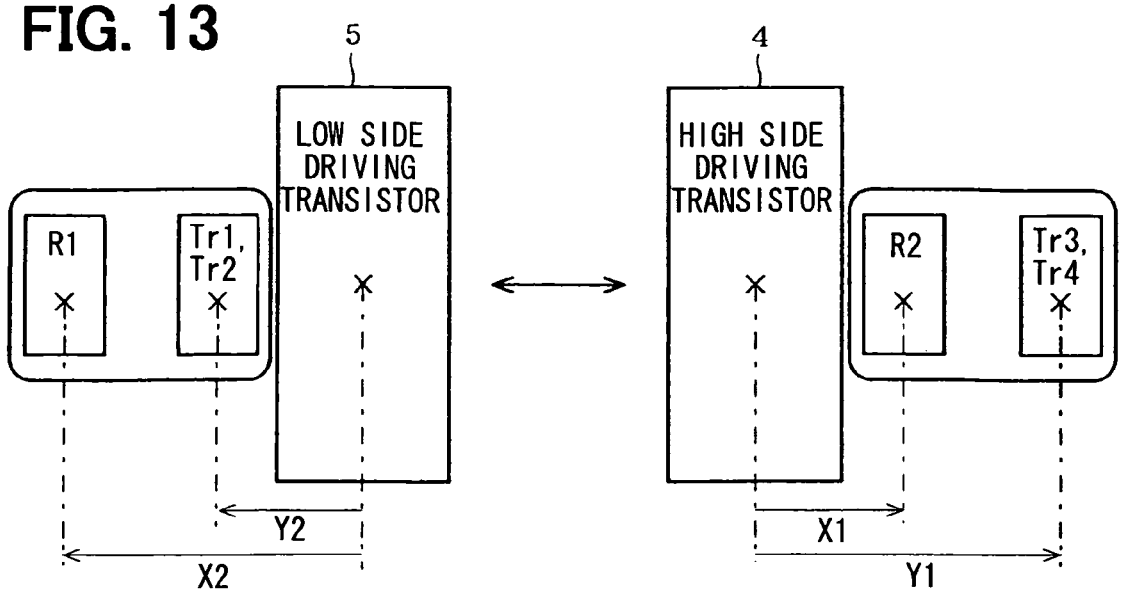
FIG. 13 schematically shows a layout of components of a load-driving circuit in an integrated circuit, as a sixth embodiment of the present invention.
Figure 14A:
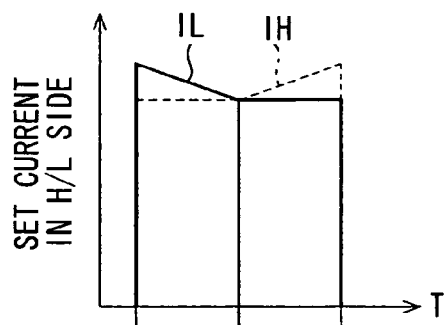
FIGS. 14A, 14B and 14C show a set current and a drain-source voltage in the sixth embodiment, corresponding to FIGS. 2A, 2B and 2C, respectively.
Figure 14B:
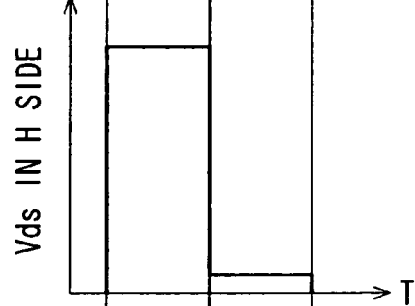
Figure 14C:
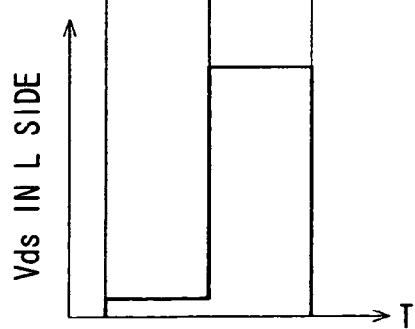

A sixth embodiment of the present invention will be described with reference to FIG. 13 and FIGS. 14A-14C. As shown in FIG. 13, the low side resistor R2 is positioned close to the MOSFET 4 (X1) in a region where the MOSFET 4 is formed, while the transistors Tr3, Tr4 are positioned apart from the MOSFET 4 (Y1). In a region where the MOSFET 5 is formed, the transistors Tr1, Tr2 are positioned close to the MOSFET 5 (Y2) while the high side resistor R1 is positioned apart from the MOSFET 5 (X2). Relations between these distances are: X1<Y1 and X2>Y2.

At the beginning of the control operation, the current IH (IH<IL) is supplied to the load 2 as in the first embodiment. As the MOSFET 4 is heated, the resistance of the resistor R2 increases due to the heat of the MOSFET 4, and the current IL gradually decreases. When the current IL becomes lower than IH (IL<IH), the low side current control circuit 19 is switched to the constant current control, and the high side current control circuit 18 is switched to the full-on control. Then; the MOSFET 5 is heated, and the current IH is increased because the transistors Tr1, Tr2 are heated by the heat of MOSFET 5. The current IL is maintained at the same level (refer to FIG. 14A).

In the sixth embodiment, the current IH set in the high side continues to increase after the low side current control circuit 19 is switched to the constant current control. Therefore, switching of controls is stably performed.

Figure 15:
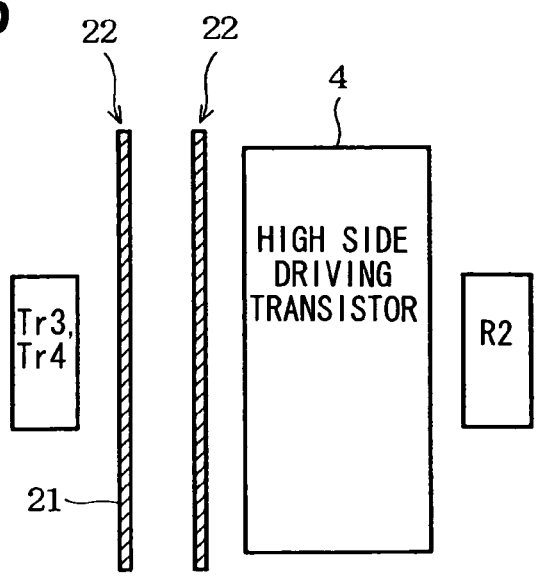
FIG. 15 schematically shows a layout of components of a load-driving circuit in an integrated circuit, as a seventh embodiment of the present invention.

A seventh embodiment of the present invention will be described with reference to FIG. 15. In this embodiment, the low side resistor R2 is positioned close to the high side MOSFET 4 to transfer heat generated in the MOSFET 4 operated under the constant current control to the low side resistor R2. The transistors Tr3, Tr4 forming the low side current mirror circuit 16 are positioned so that the heat generated in the MOSFET 4 is not transferred thereto. For this purpose, trenches 22 in which insulation films 21 are disposed are formed between the MOSFET 4 and the transistors Tr3, Tr4. The heat generated in the MOSFET 4 can be interrupted by the insulation films 21 without making a distance between the MOSFET 4 and the transistors Tr3, Tr4 large because a heat conductivity of the insulation film 21 is lower than that of a substrate of the IC chip such as silicon.

Figure 16:
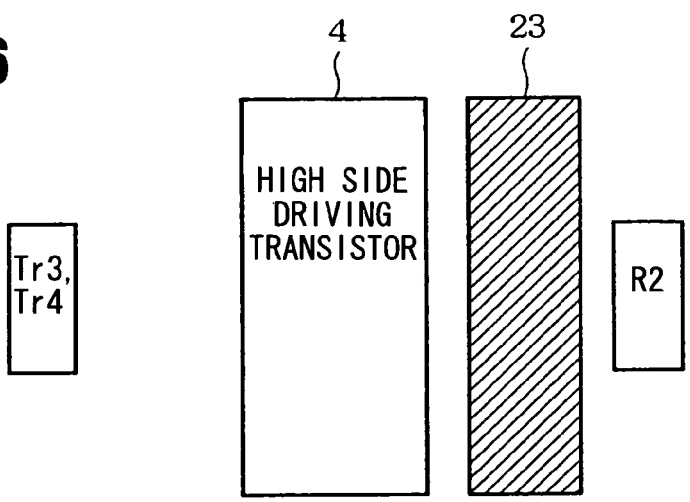
FIG. 16 schematically shows a layout of components of a load-driving circuit in an integrated circuit, as an eighth embodiment of the present invention.

An eighth embodiment of the present invention will be described with reference to FIG. 16. In this embodiment, the transistors Tr3, Tr4 are positioned apart from the MOSFET 4 to decrease effects of the heat generated in the MOSFET 4 operating under the constant current control. The low side resistor R2 is positioned so that the heat generated in the MOSFET 4 is easily transferred thereto. For this purpose, metallic wiring 23 is positioned between the MOSFET 4 and the low side resistor R2. Since the wiring 23 made of a metallic material such as gold, copper or aluminum has a higher heat conductivity than an insulation material disposed between components or between wirings, the heat generated in the MOSFET 4 is easily transferred to the low side resistor R2. The wiring 23 may be either a wiring for signal transmission or a wiring for heat radiation.

Figure 17:
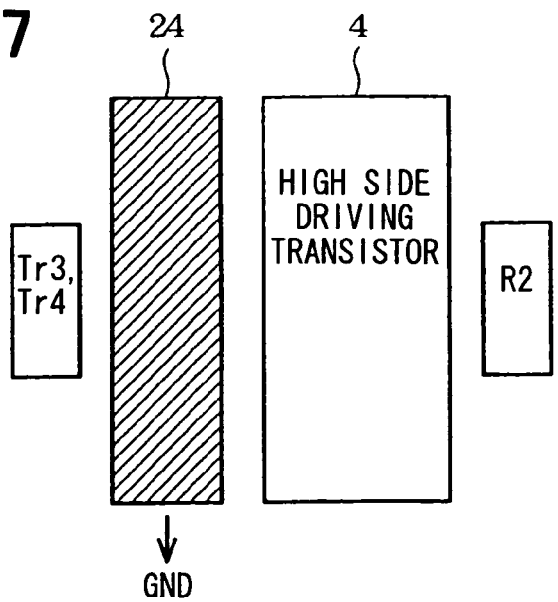
FIG. 17 schematically shows a layout of components of a load-driving circuit in an integrated circuit, as a ninth embodiment of the present invention.
Figure 18A:
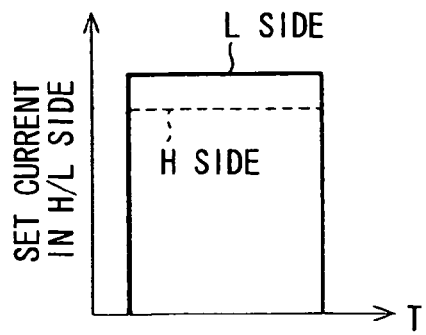
FIGS. 18A, 18B and 18C show a set current and a drain-source voltage in a conventional load-driving circuit, corresponding to FIGS. 2A, 2B and 2C, respectively.
Figure 18B:
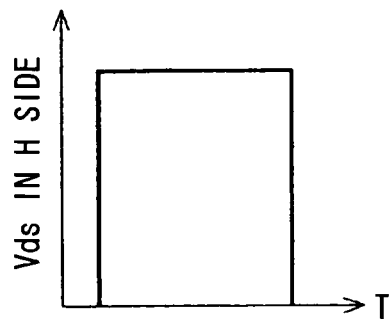
Figure 18C:
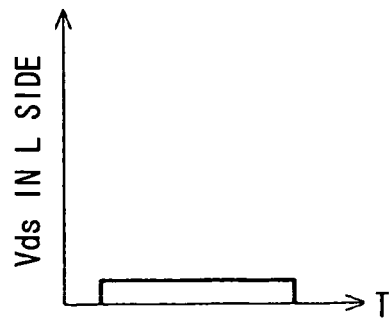
Figure 19:
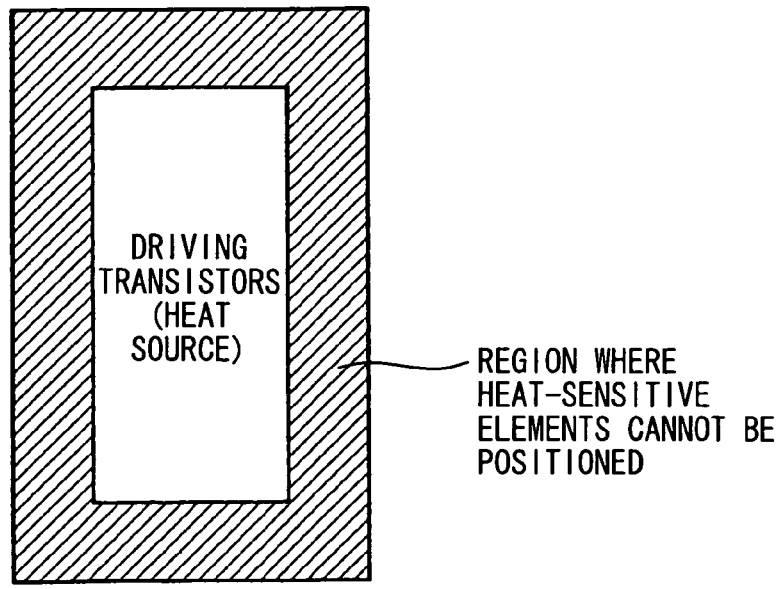
FIG. 19 schematically shows a region where heat-sensitive elements cannot be positioned in a conventional load-driving circuit.

A ninth embodiment of the present invention will be described with reference to FIG. 17. In this embodiment, the low side resistor R2 is positioned to be heated by heat generated in the MOSFET 4 operating under the constant current. The transistors Tr3, Tr4 are positioned so that they are not heated by the heat generated in the MOSFET 4. For this purpose, a metallic wiring 24 connected to a ground pattern is positioned between the MOSFET 4 and the transistors Tr3, Tr4. Since the ground pattern has a relatively large area to stabilize a reference potential, the heat is easily dissipated.

The present invention is not limited to the embodiments described above, but it may be variously modified. For example, though the control of the high side (HS) is started from the constant current control and the control of the low side (LS) is started from the full-on control in the foregoing embodiments, it is possible to reverse the controls between the high side and the low side. That is, the high side may be started from the full-on control and the low side may be started from the constant current control. In this case, the arrangement of the components in the high side and the low side is reversed.

Some of the embodiments described above may be selectively combined. The driving transistors 4, 5 are not limited to the LDMOSFET, but other FETs, IGBTs or bipolar transistors may be used in place of the LDMOSFETs. The insulating film is not limited to $SiO_2$, but other insulating materials may be used. The conductor is not limited to gold, copper or aluminum, but other materials may be used. The load 2 is not limited to the resistor for the airbag squib, but other loads may be driven by the load-driving circuit 1 of the present invention.

While the present invention has been shown and described with reference to the foregoing preferred embodiments, it will be apparent to those skilled in the art that changes in form and detail may be made therein without departing from the scope of the invention as defined in the appended claims.

What is claimed is:

1. The load-driving circuit formed as an integrated circuit, comprising:
   a high side driving transistor connected between a high potential terminal and a load;
   a low side driving transistor connected between the load and a low potential terminal;
   first means for controlling current supplied to the load via the high side driving transistor;
   second means for controlling current supplied to the load via the low side driving transistor, wherein elements constituting the first and the second means are positioned in the load-driving circuit so that temperature gradients are formed among the elements due to heat generated in a heat source composed of the high side and/or the low side driving transistors; and
   means for switching the high side driving transistor to constant current control from full-on control based on the temperature gradients of the low side transistor and the low side driving transistor to the full-on control from the constant current control based on the temperature gradients of the high side transistor, the switching being performed one time or more than one time.

2. The load-driving circuit as in claim 1, wherein:
   the first means is composed of a high side resistor connected in series to the high side driving transistor and a high side current mirror circuit that controls the high side driving transistor by means of current; and
   the second means is composed of a low side resistor connected in series to the low side driving transistor and a low side current mirror circuit that controls the low side driving transistor by means of current.

3. The load-driving circuit as in claim 2, wherein:
   the low side resistor is positioned close to the high side driving transistor; and
   the low side current mirror circuit is positioned apart from the high side driving transistor.

4. The load-driving circuit as in claim 2, wherein:
   the high side resistor is positioned close to the low side driving transistor; and
   the high side current mirror circuit is positioned apart from the low side driving transistor.

5. The load-driving circuit as in claim 2, wherein:
   the high side current mirror circuit is positioned close to the high side driving transistor; and
   the high side resistor is positioned apart from the high side driving transistor.

6. The load-driving circuit as in claim 2, wherein:
   the low side current mirror circuit is positioned close to the low side driving transistor; and
   the low side resistor is positioned apart from the low side driving transistor.

7. The load-driving circuit as in claim 2, wherein:
   the high side resistor is positioned close to the low side driving transistor; and
   the high side current mirror circuit is positioned close to the high side driving transistor.

8. The load-driving circuit as in claim 2, wherein:
   the low side resistor is positioned close to the high side driving transistor; and
   the low side current mirror circuit is positioned close to the low side driving transistor.

9. The load-driving circuit as in claim 2, wherein:
   the high side current mirror circuit is positioned close to and between the high side and the low side driving transistors; and
   the high side resistor is positioned apart from the high side and the low side driving transistors.

10. The load-driving circuit as in claim 2, wherein:
    the low side current mirror circuit is positioned close to and between the high side and the low side driving transistors; and
    the low side resistor is positioned apart from the high side and the low side driving transistors.

11. The load-driving circuit as in claim 2, wherein:
    the low side resistor is positioned close to and between the high side and the low side driving transistors; and
    the low side current mirror circuit is positioned apart from the high side and the low side driving transistors.

12. The load-driving circuit as in claim 2, wherein:
    the high side resistor is positioned close to and between the high side and the low side driving transistors; and
    the high side current mirror circuit is positioned apart from the high side and the low side driving transistors.

13. The load-driving circuit as in claim 2, wherein:
    the high side current mirror circuit is positioned close the low side driving transistor, and the high side resistor is positioned apart from the low side driving transistor; and the low side resistor is positioned close to the high side driving transistor, and the low side current mirror circuit is positioned apart from the high side driving transistor.

14. The load-driving circuit as in claim 2, wherein:

the low side current mirror circuit is positioned close the high side driving transistor, and the low side resistor is positioned apart from the high side driving transistor; and the high side resistor is positioned close to the low side driving transistor, and the high side current mirror circuit is positioned apart from the low side driving transistor.

15. The load-driving circuit as in claim 2, wherein:

a trench structure having an insulating material disposed therein is formed in the integrated circuit between one of the resistors or one of the current mirror circuit and one of the driving transistors generating heat therein.

16. The load-driving circuit as in claim 2, wherein:

a metallic wiring is formed in the integrated circuit between one of the resistors or one of the current mirror circuit and one of the driving transistors generating heat therein.

17. The load-driving circuit as in claim 16, wherein:

the metallic wiring is connected to a heat radiating portion.

18. A load-driving circuit formed as an integrated circuit, comprising:

a high side driving transistor connected between a high potential terminal and a load;

a low side driving transistor connected between the load and a low potential terminal;

a high side current control circuit for controlling current supplied to the load via the high side driving transistor; and a low side current control circuit for controlling current supplied to the load via the low side driving transistor, wherein temperature gradients are formed among components comprising each of the high side current control circuit and the low side current control circuit due to heat generated in the high side and/or the low side driving transistors, respectively, current in either of the high side driving transistor and the low side driving transistor is automatically switched from constant current control to full-on control, and current in the other of the high side and low side driving transistor is automatically switched from full-on control to constant current control, due to particular temperature gradients formed by particular positioning on the integrated circuit of the components comprising the high side current control circuit for sensing temperature gradient of the low side driving transistor and the low side current control circuit for sensing temperature gradient of the high side driving transistor, and the automatic switching from constant current control to full-on control and from full-on control to constant current control in the high side and/or the low side driving transistors is performed one time or more than one time.

* * * * *